(12) United States Patent
Laforet et al.

(10) Patent No.: US 9,536,960 B2
(45) Date of Patent: Jan. 3, 2017

(54) SEMICONDUCTOR DEVICE COMPRISING A FIELD ELECTRODE

(71) Applicant: Infineon Technologies Austria AG, Villach (AT)

(72) Inventors: David Laforet, Villach (AT); Franz Hirler, Isen (DE); Oliver Blank, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/748,712

(22) Filed: Jun. 24, 2015

(65) Prior Publication Data

US 2016/0013280 A1   Jan. 14, 2016

(30) Foreign Application Priority Data

Jul. 14, 2014   (DE) ........................ 10 2014 109 859

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/40 | (2006.01) | |
| H01L 29/423 | (2006.01) | |
| H01L 29/78 | (2006.01) | |

(52) U.S. Cl.
CPC ......... *H01L 29/407* (2013.01); *H01L 29/4236* (2013.01); *H01L 29/7802* (2013.01); *H01L 29/7813* (2013.01); *H01L 29/4238* (2013.01)

(58) Field of Classification Search
CPC .. H01L 29/402; H01L 29/407; H01L 29/7813; H01L 29/1095; H01L 29/0696; H01L 29/404; H01L 29/86; H01L 29/4236; H01L 29/7802
USPC ......................................... 257/330, 331, 340
See application file for complete search history.

(56) References Cited

U.S. PATENT DOCUMENTS

| | | | |
|---|---|---|---|
| 8,889,511 B2 * | 11/2014 | Yedinak | H01L 21/3065 257/340 |
| 2003/0102486 A1 | 6/2003 | Inoue et al. | |
| 2005/0167749 A1 * | 8/2005 | Disney | H01L 29/0696 257/341 |
| 2009/0140327 A1 | 6/2009 | Hirao et al. | |

(Continued)

FOREIGN PATENT DOCUMENTS

DE   102009044474 B4   5/2013

*Primary Examiner* — Thien F Tran
(74) *Attorney, Agent, or Firm* — Murphy, Bilak & Homiller, PLLC (57) ABSTRACT

A semiconductor device includes a gate electrode adjacent to a body region in a semiconductor substrate. The semiconductor device further includes a field electrode in a field plate trench in the main surface, the field plate trench having an extension length in a first direction parallel to a main surface. The extension length is less than the double of an extension length in a second direction that is perpendicular to the first direction parallel to the main surface. The extension length in the first direction is more than half of the extension length in the second direction. The field electrode is insulated from an adjacent drift zone by means of a field dielectric layer. A field plate material of the field electrode has a resistivity in a range from $10^5$ to $10^{-1}$ Ohm·cm.

16 Claims, 8 Drawing Sheets

(56) References Cited

U.S. PATENT DOCUMENTS

| | | |
|---|---|---|
| 2010/0117144 A1 | 5/2010 | Hirler et al. |
| 2011/0169103 A1* | 7/2011 | Darwish .............. H03K 17/687 257/409 |
| 2013/0062688 A1* | 3/2013 | Kobayashi ............ H01L 29/407 257/330 |

* cited by examiner

SEMICONDUCTOR DEVICE COMPRISING A FIELD ELECTRODE

PRIORITY CLAIM

This application claims priority to German Patent Application No. 10 2014 109 859.5 filed on 14 Jul. 2014, the content of said application incorporated herein by reference in its entirety.

BACKGROUND

Power transistors commonly employed in automotive and industrial electronics require a low area-specific on-resistance ($R_{on} \times A$) while securing a high voltage blocking capability. For example, a MOS ("metal oxide semiconductor") power transistor should be capable, depending upon application requirements, to block drain-to-source voltages Vds of some tens to some hundreds or thousands of volts. MOS power transistors typically conduct very large currents which may be up to some hundreds of amperes at typical gate-source voltages of about 2 to 20 V.

The use of power MOSFETs ("metal oxide semiconductor field effect transistors") with charge compensation using an isolated field-plate or field-electrode offers an opportunity to reduce the area-specific on-resistance of such a device. This improvement in on-resistance is usually linked to an increased output charge compared to a standard MOSFET device due to the higher doping of the drift region. The output charge may cause a voltage overshoot at fast switching of the device, for example in a synchronous rectification stage of a power supply.

Generally, novel concepts of power MOSFETs which result in improved device characteristics are investigated.

It is an object to provide a semiconductor device in which a trade-off between area-specific on-resistance and switching behavior is improved.

SUMMARY

According to an embodiment, a semiconductor device includes a gate electrode adjacent to a body region in a semiconductor substrate, and a field electrode in a field plate trench in a main surface of the semiconductor substrate, the field plate trench having an extension length in a first direction parallel to the main surface. The extension length is less than the double of an extension length in a second direction perpendicularly to the first direction parallel to the main surface. The extension length in the first direction is more than half of the extension length in the second direction. The field electrode is insulated from an adjacent drift zone by means of a field dielectric layer, and a field plate material of the field electrode has a resistivity in a range from $10^5$ to $10^{-1}$ Ohm·cm.

According to another embodiment, a semiconductor device includes a gate electrode adjacent to a body region in a semiconductor substrate, and a field electrode in a field plate trench in a main surface of the semiconductor substrate, the field plate trench extending at the main surface and being electrically coupled to a source terminal at a plurality of positions, and a contact plug for electrically coupling the field electrode to a terminal. The contact plug comprises a contact material having a resistivity in a range from $10^5$ to $10^{-1}$ Ohm·cm.

According to an embodiment, a semiconductor device comprises a gate electrode adjacent to a body region in a semiconductor substrate, and a field electrode in a field plate trench in a main surface of the semiconductor substrate. The field plate trench has an extension length in a first direction, the extension length being less than the double of an extension length in a second direction parallel to the main surface, perpendicularly to the first direction, and the extension length in the first direction is more than half of the extension length in the second direction. The semiconductor device further comprises a contact plug for electrically coupling the field electrode to a terminal, the contact plug comprising a contact material having a resistivity between $10^5$ to $10^{-1}$ Ohm·cm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top," "bottom," "front," "back," "leading," "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

The Figures and the description illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e., whether the transistor is a p-channel or an n-channel transistor. The Figures may include polarity-sensitive components, e.g., diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer," "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

Figure 1A:
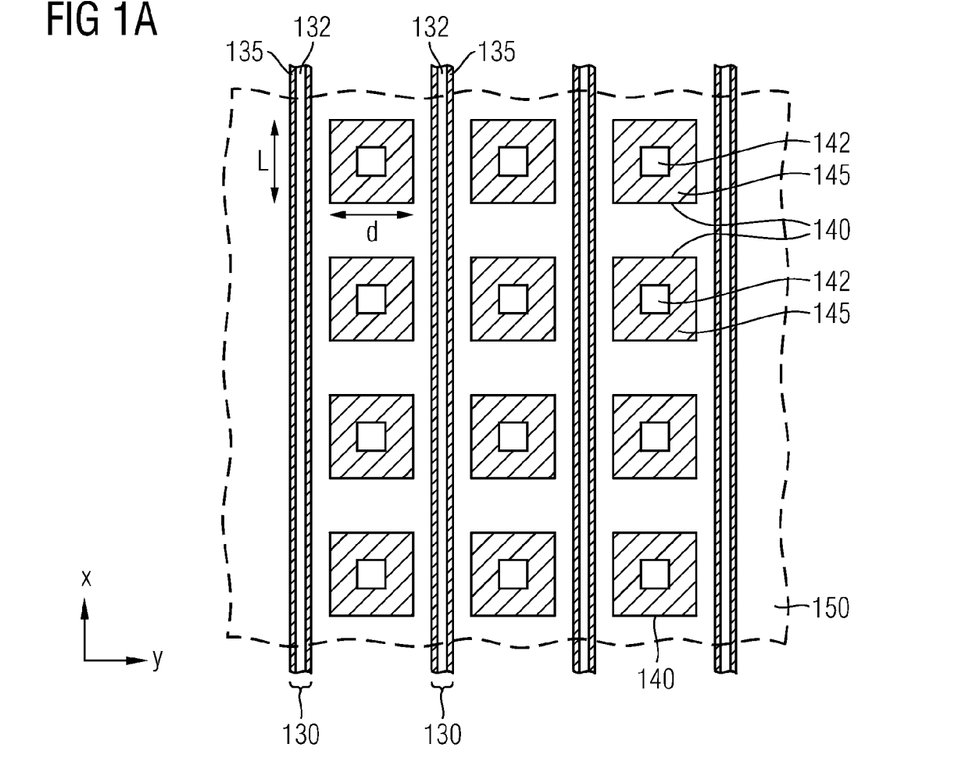
FIG. 1A shows a plan view of a semiconductor device according to an embodiment.

FIG. 1A shows a plan view of an example of a semiconductor device according to an embodiment. The semiconductor device comprises a gate electrode 132 adjacent to a body region 125 in a semiconductor substrate 100. The semiconductor device further comprises a field electrode 142 in a field plate trench 140 in a main surface of a semiconductor substrate. The field plate trench 140 has an extension length L in a first direction (e.g., the x direction) parallel to the main surface. The extension length in the first direction is less than the double of an extension length d in a second direction (e.g., the y direction) perpendicularly to the first direction. The extension length in the first direction is more than half of the extension length in the second direction. The field electrode 142 is insulated from adjacent substrate material by means of a field dielectric layer 145. The field plate material of the field electrode 142 has a resistivity in a range from $10^5$ to $10^{-1}$ Ohm·cm.

As will be explained later with reference to FIG. 1C, the semiconductor device illustrated in FIG. 1A implements a vertical MOSFET, in which upon application of a suitable voltage to the gate electrode 132 a conductive inversion channel may be formed in a body region adjacent to the gate electrode 132, the conductive channel directing a channel current in the vertical direction, i.e., the z direction. The gate electrode 132 may be disposed in a gate trench 130 formed in a main surface 110 of the semiconductor substrate 100. Alternatively, the gate electrode 132 may be disposed over the semiconductor substrate 100. For example, the gate electrode 132 may be arranged so as to be completely disposed over the semiconductor substrate, without a portion of the gate electrode 132 extending into the semiconductor substrate 100.

The field plate trench 140 extends in a third or vertical direction, i.e., the z direction, perpendicularly with respect to the depicted plane of the drawing of FIG. 1A. According to an embodiment, a maximum extension length L, d of the field plate trench 140 in a plane parallel to a main surface of the substrate is smaller than a maximum extension length t in the z direction. For example, a ratio of a maximum horizontal extension length L, d with respect to a maximum vertical extension length t of the field plate trench 140 may be in a range from 0.05 to 0.5. According to a further embodiment, the field plate trench 140 may have a needle shape in which the ratio of the maximum horizontal extension length of the trench L, d with respect to a maximum vertical extension length t is in a range from 0.05 to 0.5. The sidewalls of the field plate trench 140 may not be exactly perpendicular with respect to the main surface of the semiconductor substrate but may be curved. Due to the specific shape of the field plate trenches, a greater portion of the drift zone of the power MOSFET per field plate trench area may be charge compensated compared with a case in which the field plate trench has a stripe-shaped shape. As a result, the area needed for the field plate trench is reduced so that more effective area may be used for load current conduction. In more detail, as is also illustrated in FIG. 1A, each of the field electrodes 142 may perform a charge-compensation with respect to the semiconductor material disposed adjacent with respect to the first direction (x direction) and the second direction (y direction).

On the other hand, each of the field electrodes 142 may be directly in contact with an external terminal, e.g., a source terminal, so that an external potential may be effectively applied to the field electrode 142. Employing the field plate material to have a resistivity in a range from $10^5$ to $10^{-1}$ Ohm·cm results in an improved damping of the drain-source voltage overshoot during switch-off. The field plate material of the field electrode has a resistivity in a range from $10^5$ to $10^{-1}$ Ohm·cm. For example, the material may be polysilicon doped with a low impurity concentration. According to an embodiment, the impurity concentration may be less than $1E19$ cm$^{-3}$ or even less than $1E18$ cm$^{-3}$. As a consequence, the field plate resistance may be 0.1 to 10 Ohm or 1 to 10 Ohm. According to further embodiments, oxygen or nitride doped polysilicon may be used. This material is also known as SIPOS ("semi-insulating polycrystalline films"). For example, these films may be deposited by a low pressure chemical wafer deposition (LPCVD) technique, by pyrolysis of nitrous oxide (N2O) and silan (SiH4) at temperatures from 600° C. to 700° C. According to further embodiments various forms of carbon may be used. For example, amorphous silicon carbide may be used.

Due to the architecture of the field plate trenches 140, the field electrode 142 of each single field plate may be electrically coupled directly to the source plate 150. This results in a very low resistive connection between all field electrodes and the source plate. Hence, in contrast to established technologies, a high resistive material may be employed as a field plate material without the danger that the source potential cannot be transferred homogeneously along the field plate, when the field plate is e.g., disposed in a trench extending along the y direction for a longer length.

As a consequence, the device may be switched in a very homogenous manner, since a locally occurring dynamic avalanche effect is avoided. Accordingly, a negative impact on the switching transient of the device may be avoided. As a result, lower switching losses and the losses related to dynamic avalanche effects may be avoided or reduced. Hence, a higher switching frequency can be realized. At the same time, the drain-source voltage overshoot can be controlled by the specific resistance of the field plate material.

Thus, due to the combination of the resistivity of the field plate material and the specific design of the field plate trenches 140 the beneficial properties of the field plate material may be used and at the same time, the potential applied to the field plate is transferred to the entire field electrode instantaneously, due to the decreased length of the connection material. Thus, the special geometry enables a high resistive material to be used as the field plate material, which on the other hand improves the damping of the drain-source voltage overshoot during switch off.

The field plate trench 140 may have a circular, annular, star-like, rectangular, hexagonal, rhombic or any other suitable polygonal shape in a cross-sectional view parallel to the main surface of the semiconductor substrate. The field electrode 142 is insulated from an adjacent drift zone by means of a field dielectric layer 145. The field dielectric layer may be disposed to entirely insulate the field electrode 142 from the adjacent substrate material as is, for example, shown in FIG. 1A. According to a further embodiment, the field dielectric layer 145 may only be disposed in a lower portion of the field plate trench 140, and the upper portion of the field electrode is in contact with the adjacent source region of the power MOSFET. For example, the field plate trenches 140 may have a diameter of 0.5 μm to 7 μm and may have a depth of 3 to 30 μm depending on the voltage class. Multiple field plate trenches 140 may be subsequently arranged in parallel to one continuous gate trench 130, for example.

According to an embodiment, the gate trenches 130 may run in the first direction. Mesas 137 are disposed between adjacent gate trenches 130. According to further embodiments, the gate trenches 130 may be arranged in different manners. For example, the gate trenches 130 may be arranged to form a grid-like pattern. The shape of the grid may be hexagonal or rectangular. For example, the gate trenches 130 may form a rectangular grid, with the field plate trenches 140 being disposed in the center of each of the mesas 137.

FIG. 1A further shows a source plate 150 that may be electrically coupled to a source terminal and which may be arranged over the semiconductor substrate. The source plate 150 may be in direct contact with the field electrodes 142. Accordingly, when manufacturing the semiconductor device illustrated in FIG. 1A, the field electrodes 142 may be electrically coupled to the source plate 150 by directly forming the source plate 150 over the semiconductor device. According to a further implementation, contact plugs may electrically couple the field plates 142 to the source plate 150. For example, contact holes may be etched in an insulating material, followed by forming a conductive material so as to form a contact plug for electrically coupling the field electrode 142 to the source plate 150.

FIG. 1A shows an example of an arrangement of the field plate trenches 140. As is illustrated, the field plate trenches 140 are disposed in a rectangular pattern in which the field plate trenches 140 are disposed in rows and columns. As is to be clearly understood, any other pattern may be used. For example, the field plate trenches 140 of every second column may be shifted by half a distance between adjacent field plate trenches 140 in the first direction so that a denser pattern of field plate trenches is achieved.

Figure 1B:
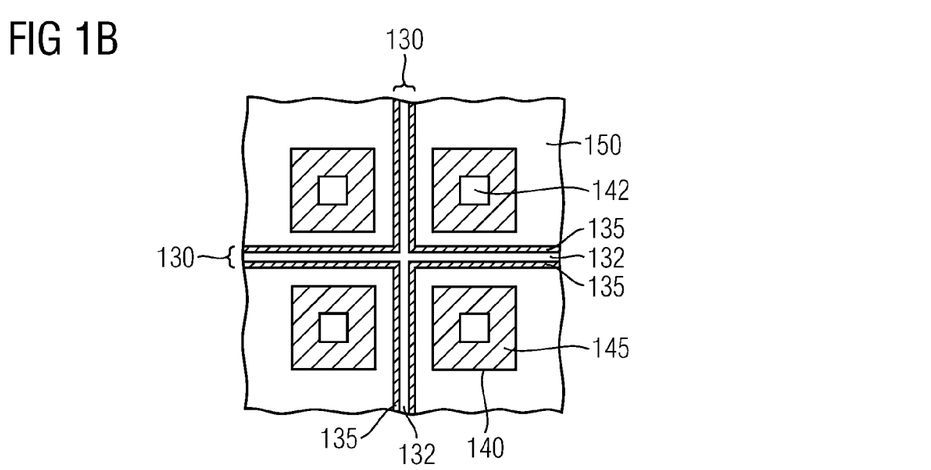
FIG. 1B shows a plan view of a semiconductor device according to a further embodiment.

FIG. 1B shows a further example of an arrangement of the field plate trenches 140 and the gate electrode 132. As is shown, the gate electrodes 132 may extend in the first and in the second direction to form a grid-like pattern. The field plate trenches 140 are disposed between the points of intersection of the gate electrodes 132.

Figure 1C:
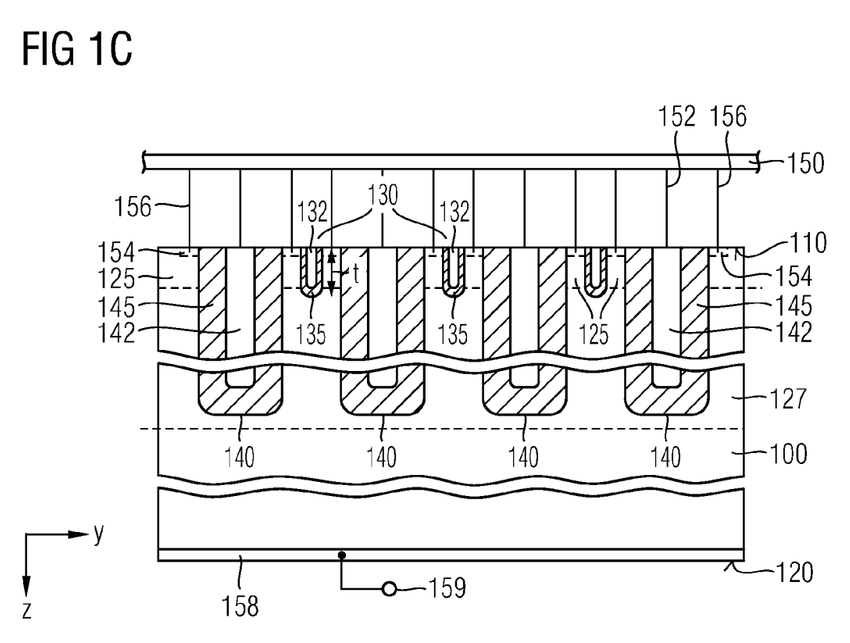
FIG. 1C shows a cross-sectional view of the semiconductor device illustrated in FIGS. 1A and 1B, according to an embodiment.

FIG. 1C shows a cross-sectional view of the semiconductor device shown in FIG. 1A. For example, the cross-sectional view of FIG. 1C is taken along the y-direction so as to intersect a plurality of field plate trenches 140. Field plate trenches 140 are formed in a main surface 110 of a semiconductor substrate 100 so as to extend in a third direction (z-direction). Moreover, gate trenches 130 are formed in the main surface 110 of the semiconductor substrate. The field plate trenches 140 extend to a greater depth than the gate trenches 130. The gate electrodes 132 are insulated from an adjacent substrate material by a gate dielectric 135. Further, the field electrodes 142 are insulated from an adjacent drift zone 127 by the field dielectric 142. As has been discussed above, the field dielectric layer 142 may be formed so as to vertically extend along the entire sidewall of the field plate trench 140. According to further implementations, the field dielectric layer 145 may be disposed in a lower portion of the field plate trench and extend to a predetermined height. A source region 154 is disposed adjacent to the main surface 110 of the semiconductor substrate. The source region 154 may be of a first conductivity type. A drain region 158 of the first conductivity type may be disposed adjacent to a back side surface 120 of the semiconductor substrate 110. The drain region 158 may be electrically coupled to a drain terminal 159. A body region 125 of a second conductivity type may be disposed adjacent to the source region 154. The body region 125 is adjacent to the gate electrode 132. A drift zone 127 may be disposed between the body region 125 and the drain region 158, the drift zone 127 being disposed adjacent to the body region 125. The drift zone 127 may be of the first conductivity type. The gate electrode 132 is absent in the field plate trench 140. The gate electrode 132 is disposed in the gate trench 130 which is a trench separate from the field plate trench 140.

In case of being switched on, a conductive inversion layer is formed at the boundary between the body region 125 and the gate dielectric layer 135. Accordingly, the transistor is in a conducting state from the source region 154 to the drain region 158 via the drain extension region or drift zone 127. In case of switching off, due to the effective field strength generated by the field electrode, carriers may be depleted from the drift zone 127. As a consequence, a current flow may be blocked at a high breakdown voltage. Accordingly, a doping concentration of the drift zone may be increased without affecting the breakdown characteristics adversely, resulting in a reduced area-specific resistance of the semiconductor device.

A source plate 150 that may be connected to a source terminal is disposed over the semiconductor substrate 100. The field electrodes 142 are electrically coupled to the source plate 150 via contact plugs 152. Further, the source regions 154 may be electrically coupled to the source plate 150 by means of source contacts. Further, the body region 125 may be electrically coupled to the source plate 150 in order to avoid a parasitic bipolar transistor which could otherwise be formed.

The semiconductor device illustrated in FIGS. 1A to 1C comprises a plurality of single transistor cells that are connected in parallel. In particular, the source regions 154 of any of the single transistor cells are electrically coupled to a common source plate 150 and the drain region 158 is coupled to a drain terminal. Moreover, the single gate electrodes 132 are electrically coupled to a common gate runner and may be connected to the same potential.

The semiconductor device illustrated in FIGS. 1A to 1C may be a vertical semiconductor device comprising a first load terminal contact (e.g., the source plate 150) at a first side of the semiconductor substrate and a second load terminal contact (e.g., the drain terminal 159) at a second side of the semiconductor substrate opposite to the first side, wherein the semiconductor device is configured to conduct a load current between the first and second load terminal contacts along a vertical direction perpendicular to the main surface.

Figure 2A:
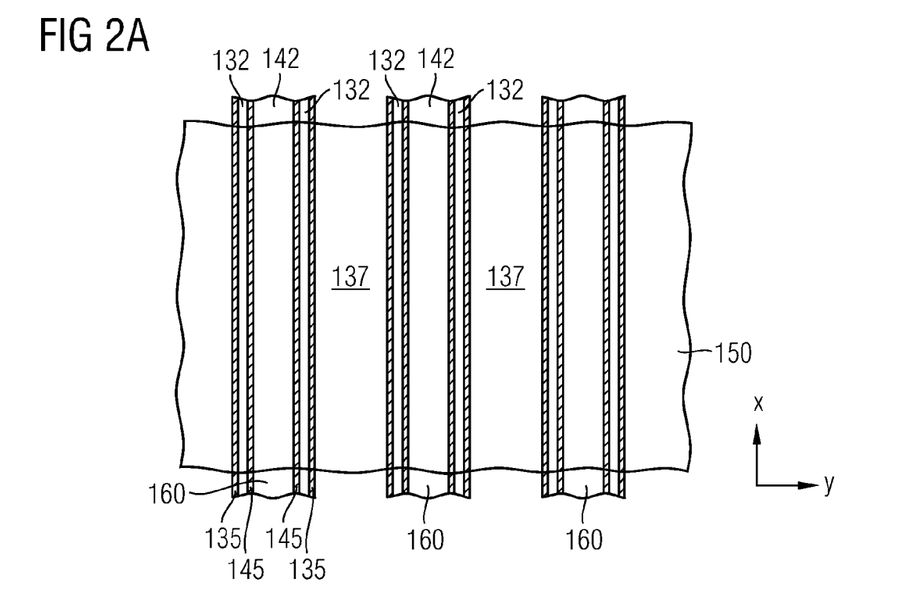
FIG. 2A shows a plan view of a semiconductor device according to a further embodiment.
Figure 2B:
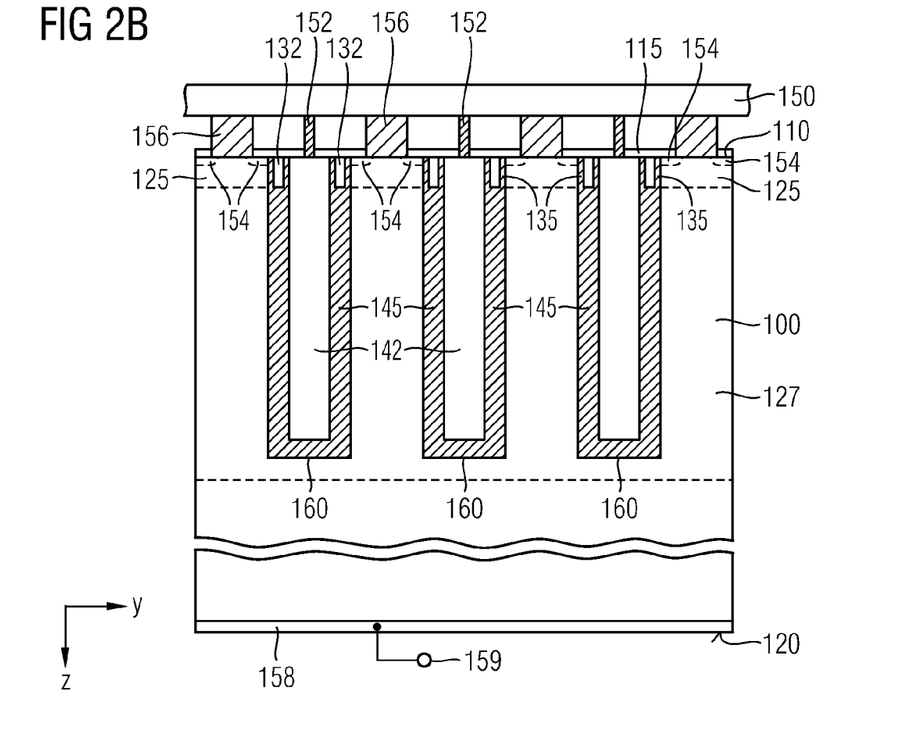
FIG. 2B shows a cross-sectional view of the semiconductor device illustrated in FIG. 2A.

FIGS. 2A and 2B show views of a semiconductor device according to a further embodiment. FIG. 2A shows a plan view of the device. The semiconductor device of FIG. 2A comprises merged trenches 160 in which the field electrodes 142 are disposed at a central portion thereof, and the gate electrodes 132 are disposed on either sides of the field electrode 142. Mesas 137 are disposed between adjacent gate trenches 130.

A gate dielectric material 132 is disposed between each of the gate electrodes 132 and the adjacent mesa 137. Further, a field dielectric layer 145 is disposed between each of the field electrodes 142 and the adjacent gate electrodes 132. A source plate 150 is disposed over the semiconductor device.

The source plate 150 may be electrically coupled to the field electrodes 142 and further the source regions of the transistors. The embodiment of FIG. 2A differs from the embodiment of FIG. 1A in that no single needle trenches 140 are formed but the field plate trenches continuously extend parallel to the main surface. An extension length in a first direction (e.g., the x direction) may be more than the double of an extension length in a second direction (e.g., the y direction), perpendicular to the first direction. For example, the field plate trenches 140 may extend parallel to the gate trenches 130. According to an embodiment, field plate trenches 140 may be merged with the gate trenches 130. Differently stated, the field electrode 142 and the gate electrode 132 may be disposed in one single trench 160. According to a further embodiment, the field electrode 142 and the gate electrode 132 may also be arranged in different trenches, provided that an upper portion of the field electrode 132 is disposed adjacent to the main surface 110.

The semiconductor device of FIG. 2A comprises a gate electrode 132 adjacent to a body region 125 in a semiconductor substrate, and a field electrode in a field plate trench 140 in the main surface. The field plate trench extends parallel to a main surface. The field electrode 142 is insulated from an adjacent drift zone by means of a field dielectric layer 154. An upper portion of the field electrode 142 is disposed adjacent to the main surface 110 and the field electrode 142 is electrically coupled to a source terminal at a plurality of positions. The field plate material of the field electrode has a resistivity in a range from $10^5$ to $10^{-1}$ Ohm·cm. For example, the field plate trench 140 and the gate trench 130 may extend in the first direction.

According to an embodiment, the gate electrode 132 may disposed in a gate trench 130 in the main surface.

For example, the field electrode may be in direct contact to the source plate 150 along the whole or at least a certain portion of its extension length. According to further implementations, the field electrode may be electrically coupled via contact plugs having a short distance from each other, e.g., a distance may be 200 nm to 100 µm. The field plate material of the field electrode may be implemented in a similar manner as has been discussed above with reference to FIGS. 1A to 1C. Due to the feature that an upper portion of the field electrode is disposed adjacent to the main surface, it is possible to electrically couple the field electrode to a source terminal in a continuous or quasi-continuous manner along the first direction. This results in a very low resistive connection between all the portions of the field electrodes and the source plate. Hence, in contrast to established technologies, a high resistive material may be employed as a field plate material without the danger that the source potential cannot be transferred homogeneously along the field plate, when the field plate in a trench is electrically coupled to a source terminal at some positions having a comparative large distance, e.g., at edge portions. As a result, a very low resistive connection between the field electrode and the source terminal may be implemented.

Hence, the device may be switched in a very homogenous manner, since a locally occurring dynamic avalanche effect is avoided. Accordingly, a negative impact on the switching transient of the device may be avoided. As a result, lower switching losses and the complete avoidance of losses related to dynamic avalanche effects may be achieved. Hence, a higher switching frequency can be realized. At the same time, the drain-source voltage overshoot can be controlled by the specific resistance of the field plate material. Also according to this embodiment, due to the combination of the resistivity of the field plate material and the specific design of the field plate trenches 140 the beneficial properties of the field plate material may be used and at the same time, the potential applied to the field plate is transferred to the entire field electrode instantaneously, due to the direct connection of the field electrode to the source plate 150.

FIG. 2B shows a cross-sectional view of the semiconductor device of FIG. 2A. The cross-sectional view of FIG. 2B is taken along the y-direction. Merged trenches 160 are formed in a main surface 110 of the semiconductor substrate 100. Field electrodes 142 are disposed in the merged trenches 160. For example, the merged trenches may extend to a depth of approximately 3 to 30 μm. Further, a gate electrode 132 is disposed in an upper portion of the merged trenches 160. The gate electrodes 132 are disposed on either sides of the field electrodes 142. The gate electrode 132 is insulated from the body region 125 by means of a gate dielectric 135. Further, the gate electrode 132 is insulated from the field electrode 142 by means of the field dielectric layer 145.

The semiconductor device further comprises a source region 154 that is disposed adjacent to the main surface 110. The semiconductor device further comprises a drain region 158 that is disposed adjacent to a back side surface 120 of the semiconductor substrate 100. The drain region 158 may be electrically coupled to a drain terminal 159. A body region 125 is disposed below the source region 154. A drift zone 127 is arranged between the body region 125 and the drain region 158. The source region 154 and the drain region 158 may be of a first conductivity type. The body region 125 may be of a second conductivity type. The drift zone 127 may be of the first conductivity type. The embodiment of FIG. 2B differs from the embodiment illustrated in FIGS. 1A to 1C in that the field electrode 142 has a different shape or architecture and, for example, may be disposed in the same trenches 160 as the gate electrode 132. The further components and the functionality of the device are quite similar. The field electrode 142 extends along the main surface, e.g., in the x-direction perpendicular to the y direction. The field electrode 142 is disposed at a central portion of the merged trenches 160 so that the field electrode 142 contacts the main surface 110 and an electrical contact 152 to the field electrode 142 may be accomplished in a continuous or quasi-continuous manner. Source contacts 156 are provided so as to contact the source regions 154 and the body regions 125.

Figure 3A:
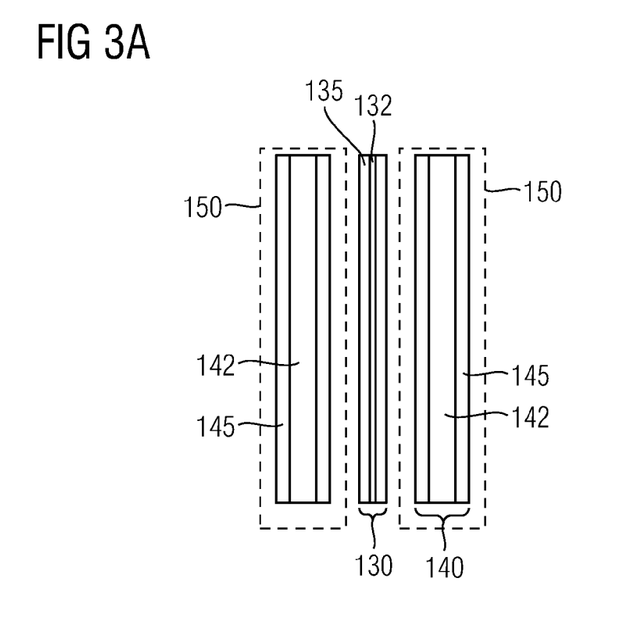
FIG. 3A shows a plan view of a semiconductor device according to a further embodiment.

FIG. 3A shows a further embodiment, according to which the gate electrode 132 and the field plate 142 are disposed in separate trenches. The structure of the single transistors of the semiconductor device of FIG. 3A is similar to the structure of the transistors of the embodiment of FIGS. 1A to 1C. In contrast to the embodiment of FIG. 1A to 1C, the field plate 142 is disposed in extending field plate trenches 140 that are different from needle field plate trenches shown in FIGS. 1A to 1C. However, a cross-sectional view of the semiconductor device is identical to the cross-sectional view of FIG. 1C so that a description of the cross-sectional view is omitted. According to the embodiment, gate electrode 132 is disposed in a gate trench 130 extending in the first direction (e.g., the x direction), and the field plate 142 is disposed in a field plate trench 140 extending in the first direction. The field plate trench 140 and the gate trench 130 are separate from each other. Accordingly, a surface of the field plate 142 is arranged adjacent to the main surface 110 of the semiconductor substrate 100, and a plurality of contacts to the field plate 142 or quasi-continuous contacts may be present. The material of the field plate 142 may be any of the materials as discussed above. The source plate 150 may be disposed so as to contact the field plate 142 in a continuous manner.

Figure 3B:
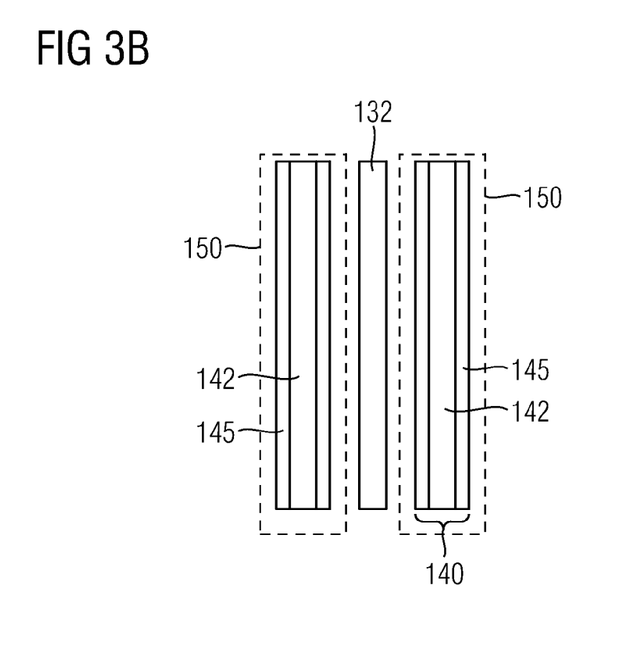
FIG. 3B shows a plan view of a semiconductor device according to a further embodiment.

According to a further embodiment, the gate electrode 132 is not arranged in a gate trench but is implemented as a planar gate electrode 132. For example, the term "planar gate electrode" describes a gate electrode that is entirely disposed over the main surface of the semiconductor substrate 100, without a portion of the gate electrode extending in the semiconductor substrate 100. FIG. 3B illustrates a plan view of a semiconductor device comprising a planar gate electrode 132. The source plate 150 may be disposed so as to contact the field plate 142 in a continuous manner.

Figure 3C:
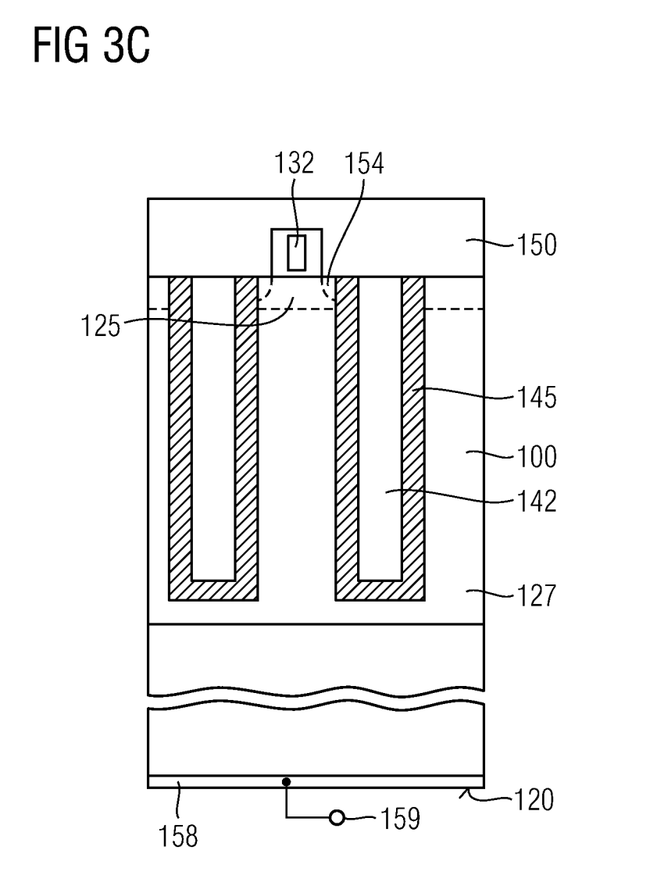
FIG. 3C shows a cross-sectional view of a semiconductor device according to a further embodiment.

FIG. 3C shows a cross-sectional view of the semiconductor device. The semiconductor device comprises a source region 154, a body region 125, and a drain region 158. A drift zone 127 is disposed between the body region 125 and the drain region 158. The gate electrode 132 is disposed in a layer over the semiconductor substrate 100. A gate dielectric is arranged between the gate electrode 132 and the body region 125. It is to be noted that the semiconductor device may comprise further components that are not shown in this Figure.

Figure 4A:
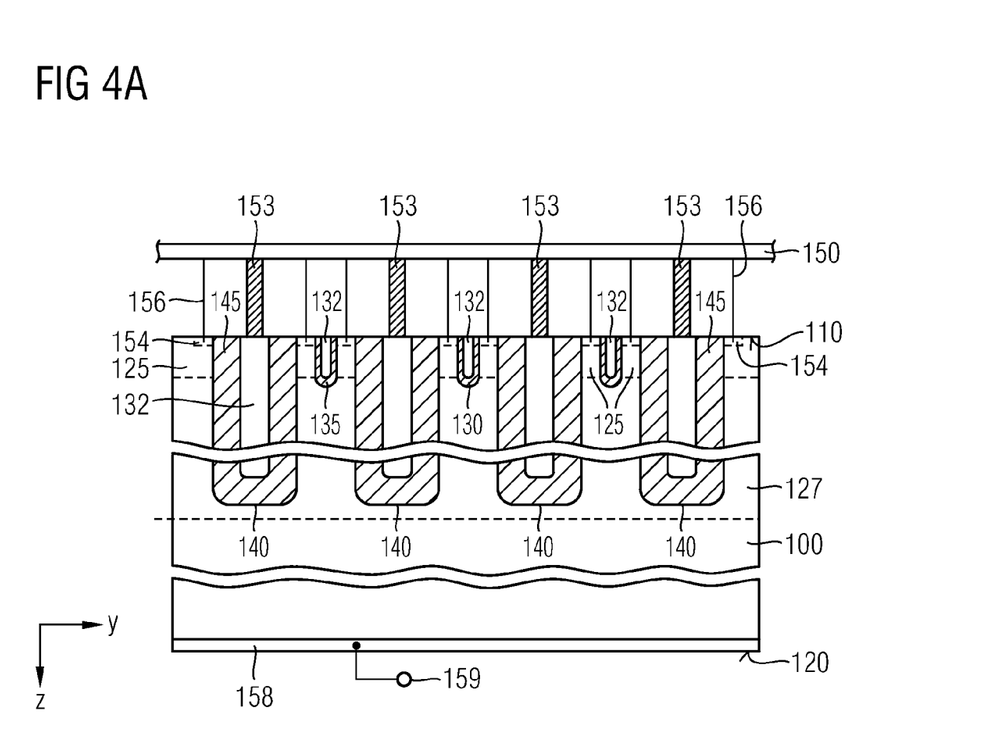
FIG. 4A shows a cross-sectional view of the semiconductor device according to a further embodiment.

FIG. 4A shows a further embodiment that is based on the architecture of the embodiments illustrated in FIGS. 1A to 1C and 3A to 3C. The embodiment of FIG. 4A differs from the embodiments of FIGS. 1A to 1C and 3A to 3C in that a high resistive contact plug 153 electrically couples the field electrode 132 to the source plate 150. The high-resistive contact plug 153 comprises a contact material having a resistivity in a range from $10^5$ to $10^{-1}$ (1E5 to 1E−1) Ohm·cm. In addition and in further contrast to the embodiment of FIGS. 1A to 1C and 3A to 3C, the field plate material may have a resistivity of less than $10^{-2}$ (1E−2) Ohm·cm. For example, the field plate material may comprise a metal or doped polysilicon having a doping concentration of more than $1E20$ cm$^{-3}$. The contact material having the high resistivity may be any of the materials mentioned above with respect to the embodiments of FIGS. 1A to 1C for the high resistive field plate material. In particular, the contact material may be polysilicon doped at a doping concentration in a range from $1E16$ cm$^{-3}$ and $1E19$ cm$^{-3}$, semi-insulating polysilicon (SIPOS) and carbon as has been discussed above. The further components and the functionality of the semiconductor device of FIG. 4A are very similar to the respective components and the functionality of the semiconductor device of FIGS. 1A to 1C and 3A to 3C.

Figure 4B:
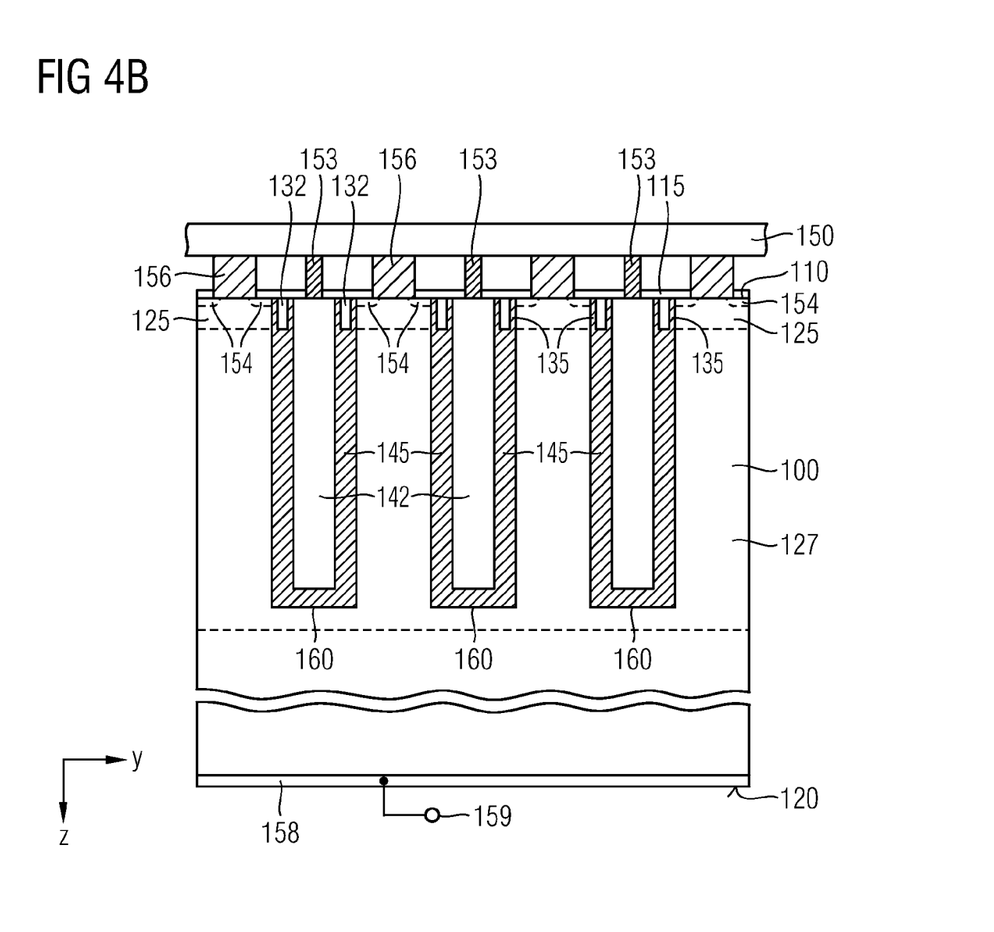
FIG. 4B shows a cross-sectional view of the semiconductor device according to a further embodiment.

FIG. 4B shows a further embodiment which is based on the architecture of the embodiment shown in FIGS. 2A and 2B. Differing from the embodiment illustrated in FIGS. 2A and 2B, the semiconductor device illustrated in FIG. 4B comprises a contact plug 153 of a high-resistive material for electrically coupling the field electrode 142 to a terminal or the source plate 150. The contact plug comprises a contact material having a resistivity in a range from $10^5$ to $10^{-1}$ (1E5 to 1E−1) Ohm·cm. Moreover and in contrast to the embodiment of FIGS. 2A and 2B, the field electrode 142 may comprise a field plate material having a resistivity less than $10^{-2}$ Ohm·cm. For example, the field plate material may comprise a metal or doped polysilicon having a doping concentration of more than $1E20$ cm$^{-3}$. For example, the contact material may be selected from the group consisting of polysilicon doped at a doping concentration between $1E16$ cm$^{-3}$ and $1E19$ cm$^{-3}$, semi-insulating polysilicon (SIPOS) and carbon as has been discussed above. The further components and the functionality of the semiconductor device of FIG. 4B are very similar to the respective components and the functionality of the semiconductor device of FIGS. 2A and 2B.

According to the embodiments of FIGS. 4A and 4B, the resistivity of the field plate material and of the contact material of the contact plug 153 may be independently selected. Accordingly, the contact material may be selected so as to efficiently damp the drain-source voltage overshoot during switch off, while the resistivity of the field plate material may be selected to reduce local dynamic avalanche effects and avoid switching losses, resulting in an increased switching speed.

According to the embodiments described herein, the gate electrode 132 is not disposed directly above the field plate 142. As a result, it is possible to provide continuous or quasi-continuous contacts between the field plate and a source plate 150, for example. The specific implementation of the gate electrode may be arbitrarily chosen.

Figure 5A:
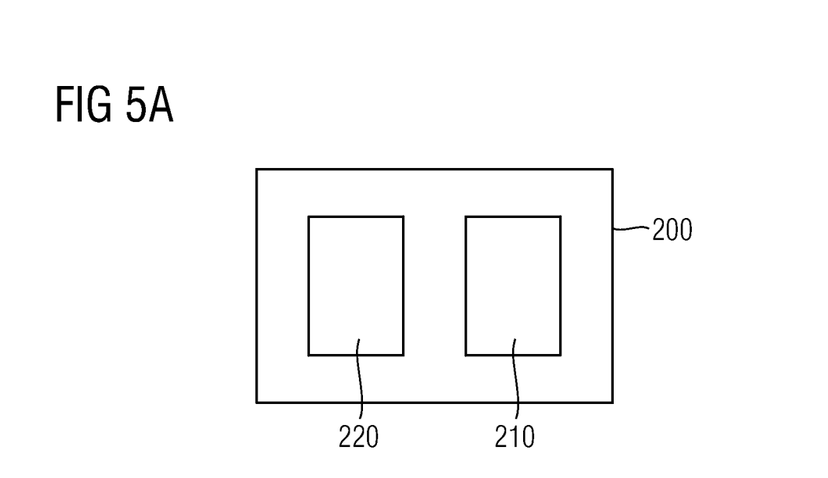
FIG. 5A shows a schematic view of a power IC according to an embodiment.

FIG. 5A shows an example of a power IC 200 according to an embodiment. The power IC 200 comprises a semiconductor device 210 such as shown in any of FIGS. 1A to 4B, and circuit elements 220 for implementing another function such as a logic circuit of the power-IC. The circuit elements may comprise active and passive elements, for example, transistors, diodes, resistors, capacitors, inductors.

Other than an integrated circuit (IC), which consists of a few to billions of active devices manufactured and interconnected on a single semiconductor body, according to an embodiment, the semiconductor device may be implemented as a discrete semiconductor transistor. The discrete semiconductor transistor is a single transistor in the semiconductor body without any other active semiconductor elements interconnected thereto. Although passive components such as resistors, capacitors and inductors may be formed in and/or on the semiconductor body, the discrete semiconductor transistor is specified to perform an elementary electronic function. Although the discrete semiconductor transistor may include a large number of transistor cells, the discrete semiconductor transistor is specified to perform an elementary electronic function and is not divisible into separate components functional in themselves as is typical for integrated circuits.

Figure 5B:
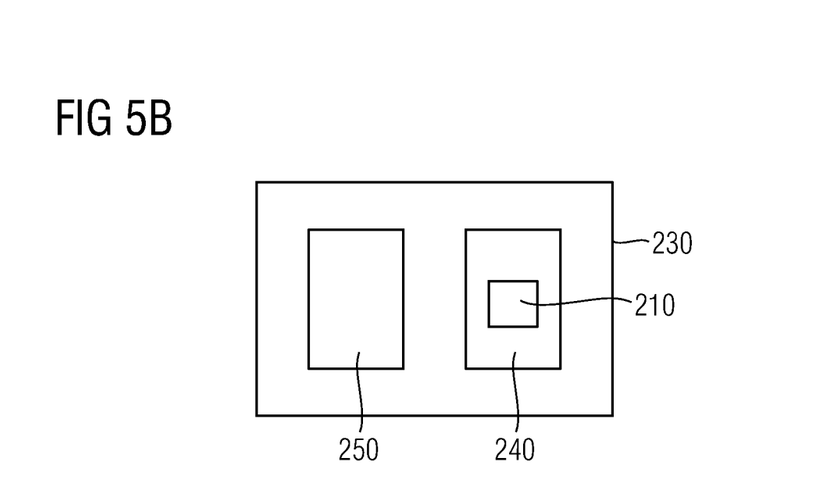
FIG. 5B shows a schematic view of a power supply and components thereof according to an embodiment.

FIG. 5B shows an example of a power supply which may comprise the semiconductor device as has been described herein above. In particular, the power supply 230 may comprise a synchronous rectifier 240 such as a buck converter. The synchronous rectifier 240 may comprise the semiconductor device 210 that has been described herein above. The power supply may further comprise further power supply components 250. As has been described above, the semiconductor device 210 shows reduced overvoltage spikes and lower switching losses. Hence, such a semiconductor device 210 may be used in a synchronous rectification device such as a buck converter. The further power supply components may comprise several controllers and drivers and further active or passive elements which are commonly used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a gate electrode adjacent to a body region in a semiconductor substrate; and
a field electrode in a field plate trench in a main surface of the semiconductor substrate, the field plate trench having an extension length in a first direction parallel to the main surface, the extension length being less than the double of an extension length of the field electrode in a second direction that is perpendicular to the first direction and is parallel to the main surface, the extension length in the first direction being more than half of the extension length in the second direction, the field electrode being insulated from an adjacent drift zone by means of a field dielectric layer,
wherein a field plate material of the field electrode has a resistivity in a range from $10^5$ to $10^{-1}$ Ohm·cm.

2. The semiconductor device according to claim 1, further comprising a source region adjacent to the main surface and a drain region adjacent to a back side surface opposing the main surface.

3. The semiconductor device according to claim 2, further comprising a source plate arranged over the field plate trench.

4. The semiconductor device according to claim 1, wherein the field plate material is selected from the group consisting of: polysilicon doped at a doping concentration between 1E16 $cm^{-3}$ and 1E19 $cm^{-3}$, semi-insulating polysilicon (SIPOS) and amorphous silicon carbide.

5. The semiconductor device according to claim 1, wherein the gate electrode is disposed in a gate trench.

6. The semiconductor device according to claim 1, wherein the gate electrode is a planar gate electrode disposed over the main surface of the semiconductor substrate.

7. A synchronous rectification device comprising the semiconductor device according to claim 1.

8. A power supply comprising the synchronous rectification device according to claim 7.

9. A semiconductor device comprising:
a gate electrode adjacent to a body region in a semiconductor substrate; and
a field electrode in a field plate trench in a main surface of the semiconductor substrate, the field plate trench extending at the main surface and being electrically coupled to a source terminal at a plurality of positions; and
a contact plug for electrically coupling the field electrode to a terminal,
the contact plug comprising a contact material having a resistivity in a range from $10^5$ to $10^{-1}$ Ohm·cm.

10. The semiconductor device according to claim 9, wherein the field electrode comprises a field plate material having a resistivity less than 1E–1 Ohm·cm.

11. The semiconductor device according to claim 10, wherein the field plate material comprises a metal or doped polysilicon having a doping concentration of more than 1E20 $cm^{-3}$.

12. The semiconductor device according to claim 9, further comprising a source region adjacent to the main surface and a drain region adjacent to a back side surface opposing the main surface.

13. The semiconductor device according to claim 9, wherein the gate electrode is disposed in a gate trench and the gate trench and the field plate trench are merged to form a single trench.

14. The semiconductor device according to claim 9, wherein the contact material is selected from the group consisting of: polysilicon doped at a doping concentration between 1E16 cm$^{-3}$ and 1E19 cm$^{-3}$, semi-insulating polysilicon (SIPOS) and amorphous silicon carbide.

15. A semiconductor device comprising:
- a gate electrode adjacent to a body region in a semiconductor substrate; and
- a field electrode in a field plate trench in a main surface of the semiconductor substrate, the field plate trench having an extension length in a first direction, the extension length being less than the double of an extension length in a second direction that is parallel to the main surface and perpendicular to the first direction, the extension length in the first direction being more than half of the extension length in the second direction; and
- a contact plug for electrically coupling the field electrode to a terminal,
- the contact plug comprising a contact material having a resistivity between $10^5$ to $10^{-1}$ Ohm·cm.

16. The semiconductor device according to claim 15, wherein the contact material is selected from the group consisting of: polysilicon doped at a doping concentration between 1E16 cm$^{-3}$ ad 1E19 cm$^{-3}$, semi-insulating polysilicon (SIPOS), and amorphous silicon carbide.

* * * * *